(12) United States Patent  
Maemura et al.

(10) Patent No.: US 9,163,791 B2  
(45) Date of Patent: Oct. 20, 2015

(54) LIGHT EMITTING DEVICE

(71) Applicant: Sharp Kabushiki Kaisha, Osaka-shi (JP)

(72) Inventors: Yosuke Maemura, Osaka (JP); Yoshiyuki Takahira, Osaka (JP); Koji Takahashi, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 0 days.

(21) Appl. No.: 14/613,006

(22) Filed: Feb. 3, 2015

(65) Prior Publication Data

US 2015/0146410 A1    May 28, 2015

Related U.S. Application Data

(63) Continuation of application No. 13/538,403, filed on Jun. 29, 2012, now Pat. No. 8,979,314.

(30) Foreign Application Priority Data

Jun. 30, 2011  (JP) ................................. 2011-146443

(51) Int. Cl.  
    *F21K 99/00*     (2010.01)  
    *H01L 33/50*     (2010.01)  
    *H01L 33/64*     (2010.01)  
    *H01S 5/00*     (2006.01)  
    *H01S 3/00*     (2006.01)  
    *F21Y 101/02*     (2006.01)

(52) U.S. Cl.  
CPC ................ *F21K 9/56* (2013.01); *H01L 33/507* (2013.01); *H01L 33/644* (2013.01); *H01S 5/005* (2013.01); *F21Y 2101/025* (2013.01); *H01S 3/005* (2013.01)

(58) Field of Classification Search  
USPC .................................................... 362/259, 84  
See application file for complete search history.

(56) References Cited

U.S. PATENT DOCUMENTS

| 6,023,371 | A | 2/2000 | Onitsuka et al. |
|---|---|---|---|
| 2005/0093008 | A1 | 5/2005 | Suehiro et al. |
| 2006/0158089 | A1 | 7/2006 | Saito et al. |
| 2006/0226772 | A1 | 10/2006 | Tan et al. |
| 2007/0080361 | A1 | 4/2007 | Malm |
| 2007/0194709 | A1 | 8/2007 | Kato et al. |

(Continued)

FOREIGN PATENT DOCUMENTS

| JP | 5-54820 | 3/1993 |
|---|---|---|
| JP | 10-338872 | 12/1998 |

(Continued)

OTHER PUBLICATIONS

Maemura et al., U.S. Appl. No. 13/364,539, filed Feb. 2, 2012; Specification and Drawings; 64 pages.

(Continued)

*Primary Examiner* — Laura Tso  
(74) *Attorney, Agent, or Firm* — Morrison & Foerster LLP

(57) ABSTRACT

In a light emitting device (10) includes a light source (11) which emits near-ultraviolet laser light and a fluorescent member (12) which includes a fluorescent body (13) that is excited by the light emitted from the light source (11) so as to emit light, the fluorescent member (12) includes a substrate (16) which is formed with a highly heat conductive member and a fluorescent body layer (14) in which particles (13d) of the fluorescent body (13) are deposited on the substrate (16).

9 Claims, 6 Drawing Sheets

(56) References Cited

U.S. PATENT DOCUMENTS

| | | |
|---|---|---|
| 2007/0273268 A1 | 11/2007 | Tojo et al. |
| 2008/0149166 A1 | 6/2008 | Beeson et al. |
| 2008/0185600 A1 | 8/2008 | Thomas |
| 2009/0321771 A1 | 12/2009 | Hattori et al. |
| 2010/0245777 A1 | 9/2010 | Ogura |
| 2010/0246159 A1 | 9/2010 | Wada |
| 2010/0328617 A1 | 12/2010 | Masuda |
| 2011/0101387 A1 | 5/2011 | Kinomoto |
| 2011/0141150 A1 | 6/2011 | Hajjar et al. |
| 2011/0149549 A1 | 6/2011 | Miyake |
| 2011/0235309 A1 | 9/2011 | Miki et al. |
| 2012/0018761 A1 | 1/2012 | Honda |
| 2012/0106126 A1 | 5/2012 | Nojima et al. |
| 2012/0145925 A1 | 6/2012 | Comstock et al. |

FOREIGN PATENT DOCUMENTS

| | | |
|---|---|---|
| JP | 2005-51194 | 2/2005 |
| JP | 2005-191514 | 7/2005 |
| JP | 2006-83219 | 3/2006 |
| JP | 2006-210491 | 8/2006 |
| JP | 2007-184165 | 7/2007 |
| JP | 2010-86815 | 4/2010 |
| JP | 2011-022021 | 2/2011 |
| JP | 2011-129354 | 6/2011 |
| JP | 2012-185403 | 9/2012 |
| WO | WO-2010/061597 | 6/2010 |
| WO | WO-2010/110204 | 9/2010 |

OTHER PUBLICATIONS

Kato et al. (1994). "Crystal structures of $TiO_2$ thin coatings prepared from the alkoxide solution via the dip-coating technique affecting the photocatalytic decomposition of aqueous acetic acid," *Journal of Materials Science* vol. (29): 5911-5915.

Lee et al. (2011). "Yellow phosphors coated with $TiO_2$ for the enhancement of photoluminescence and thermal stability," *Applied Surface Science* vol. (257): 8355-8359.

Maemura et al., U.S. Office Action mailed Jul. 29, 2014, directed to U.S. Appl. No. 13/538,403; 9 pages.

LIGHT EMITTING DEVICE

This application is a continuation of U.S. application Ser. No. 13/538,403, filed on Jun. 29, 2012, which claims priority to Japanese Patent Application No. 2011-146443 filed on Jun. 30, 2011, the contents of which are hereby incorporated by reference.

BACKGROUND OF THE INVENTION

1. Field of the Invention

The present invention relates to a light emitting device that excites a fluorescent body with near-ultraviolet light and emits light.

2. Description of the Related Art

A conventional light emitting device is disclosed in JP-A-2010-86815. This light emitting device includes a light source and a plurality of fluorescent members. The fluorescent members have fluorescent bodies that are excited by excitation light to emit red light, blue light and green light, respectively, and are provided on a heat transmission member. The light source is formed with a light emitting diode or a laser diode, and emits, as the excitation light, ultraviolet light having a wavelength shorter than the band of the wavelength of the light emitted by the fluorescent bodies. In general, the fluorescent member is formed by dispersing the particles of the fluorescent body into a sealant such as a resin or an inorganic glass.

In the light emitting device configured as described above, the excitation light formed with the ultraviolet light emitted from the light source is applied to the fluorescent members. The fluorescent bodies of the fluorescent members are excited by the excitation light, and thereby emit red light, blue light and green light, respectively. The light emitted from the fluorescent members is combined, and thus intended light is emitted When a light emitting device is used in an application where illumination light having a high brightness is required, a high-power laser diode can be used as a light source. When excitation light emitted from a light source is not utilized as illumination light, it is preferable to increase the rate of absorbing the excitation light by the fluorescent members and thereby enhance the efficiency of light emission of the fluorescent members.

When the high-power laser diode is used as the light source, the density of excitation of the emitted light is increased, and thus the fluorescent body produces heat. In the conventional fluorescent member described above, the heat produced by the fluorescent body is transmitted though the sealant and is dissipated from a substrate. Here, when the thickness of the sealant of the fluorescent member is increased so as to enhance the rate of absorbing the fluorescent member, and thus a content of the fluorescent member is increased, since the fluorescent body on the emission surface side is separated from the substrate, the heat dissipation of the fluorescent member is disadvantageously degraded. This causes the temperature of the fluorescent body to be increased, and thus the efficiency of light emission is reduced and a light emission portion is degraded. Moreover, since temperature quenching is different according to the type of fluorescent body, variations in chromaticity may occur.

Although, in the conventional fluorescent member described above, the fluorescent member is moved to change the position of application of the excitation light, and thus the increase in the temperature of the fluorescent body is reduced, a drive portion for moving the position of the application is required, with the result that disadvantageously, the consumption power is increased and its configuration is complicated.

On the other hand, since the particles of the fluorescent body are dispersed into the sealant, it is difficult to increase the content of the fluorescent body while the sealant is thin.

SUMMARY OF THE INVENTION

The present invention is made to solve the problem described above; an object of the present invention is to provide a light emitting device that can enhance the efficiency of light emission by enhancing the dissipation of heat produced by a fluorescent body and the rate of absorbing excitation light.

To achieve the above object, according to the present invention, there is provided a light emitting device including: a light source which emits near-ultraviolet laser light; and a fluorescent member which includes a fluorescent body that is excited by the light emitted from the light source so as to emit light, in which the fluorescent member includes: a substrate which is formed with a highly heat conductive member; and a fluorescent body layer in which particles of the fluorescent body are deposited on the substrate.

In this configuration, the fluorescent body is excited by the excitation light emitted from the light source and emits light having a predetermined wavelength. Since the fluorescent member has the fluorescent body layer in which the particles of the fluorescent body are deposited on the substrate formed with the highly heat conductive member, the fluorescent body layer has the fluorescent body at a high density and is formed to be thin. In this way, heat of the fluorescent body caused by the light from the light source is transmitted through the adjacent particles of the fluorescent body to the substrate and is dissipated.

In the light emitting device according to the present invention and configured as described above, the particles of the fluorescent body are continuously connected between a surface of the fluorescent body layer and the substrate. In this configuration, the heat produced by the fluorescent body on the surface of the fluorescent body layer is transmitted through the connected particles to the substrate, and is dissipated.

In the light emitting device according to the present invention and configured as described above, a content of the fluorescent body in the fluorescent body layer by volume is 69% or more.

In the light emitting device according to the present invention and configured as described above, a coating material which adheres the fluorescent body layer is arranged on the surface of the fluorescent body layer. In this configuration, the fluorescent body layer in which the particles of the fluorescent body are deposited on the substrate are adhered with the coating material, and thus the particles of the fluorescent body are prevented from coming off.

In the light emitting device according to the present invention and configured as described above, the coating material is formed of $TiO_2$.

In the light emitting device according to the present invention and configured as described above, a binder which coats the particles of the fluorescent body is included, and the adjacent particles of the fluorescent body are adhered by the binder. In this configuration, the adjacent particles of the fluorescent body are firmly adhered with the binder.

In the light emitting device according to the present invention and configured as described above, the binder is formed of silica. In this configuration, the binder has a higher resistance to ultraviolet light than a resin, and also has a high heat resistance.

According to the present invention, there is provided a method of manufacturing a light emitting device that includes a light source which emits near-ultraviolet laser light and a fluorescent member which includes a fluorescent body that is excited by the light emitted from the light source so as to emit light, in which the fluorescent member includes a substrate which is formed with a highly heat conductive member and a fluorescent body layer in which particles of the fluorescent body are deposited on the substrate, and the method of manufacturing the light emitting device includes: a dispersion step of dispersing the particles of the fluorescent body in a dispersion medium; and a fluorescent body layer formation step of forming the fluorescent body layer by depositing the particles of the fluorescent body dispersed in the dispersion medium on the substrate by an electrophoresis method or a precipitation method.

The method of manufacturing the light emitting device according to the present invention and configured as described above further includes a coating material application step of applying an alkoxide of $TiO_2$ onto the fluorescent body layer; and a firing step of firing the fluorescent member taken out of the dispersion medium and coating the fluorescent body layer with $TiO_2$.

The method of manufacturing the light emitting device according to the present invention and configured as described above further includes a binder addition step of adding a precursor of silica to the dispersion medium and coating the particles of the fluorescent body with the precursor of silica, in which, in the fluorescent body layer formation step, the fluorescent body layer is formed by the electrophoresis method, and, in the firing step, the fluorescent member is fired and the particles of the fluorescent body are coated with silica.

In the present invention, since the fluorescent member has the fluorescent body layer in which the particles of the fluorescent body are deposited on the substrate formed with the highly heat conductive member, the fluorescent body layer has the fluorescent body at a high density and is formed to be thin. Thus, it is possible to enhance the dissipation of the heat produced by the fluorescent body and increase the rate of absorbing the excitation light. It is therefore possible to enhance the efficiency of light emission of the light emitting device and to prevent variations in chromaticity caused by temperature quenching of a plurality of fluorescent bodies that emit light of different colors.

In the present invention, since the dispersion step of dispersing the particles of the fluorescent body in the dispersion medium and the fluorescent body layer formation step of forming the fluorescent body layer by depositing the particles of the fluorescent body dispersed in the dispersion medium on the substrate by the electrophoresis method or the precipitation method are provided, it is possible to easily form the fluorescent body layer where the particles of the fluorescent body are deposited on the substrate.

DETAILED DESCRIPTION OF THE PREFERRED EMBODIMENTS

Figure 1:
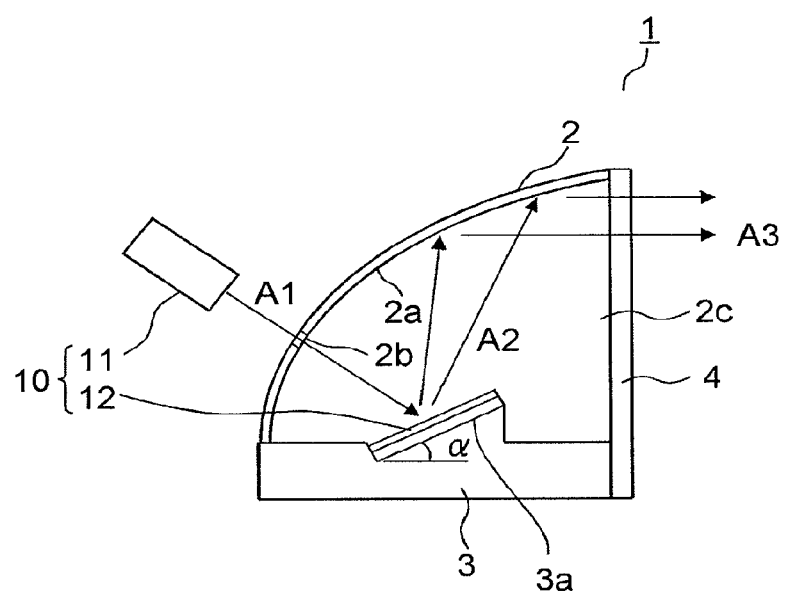
FIG. 1 is a side cross-sectional view showing a head light including a light emitting device according to an embodiment of the present invention.

An embodiment of the present invention will be described below with reference to accompanying drawings. FIG. 1 is a side cross-sectional view showing a head light of an automobile including a light emitting device according to the embodiment. The head light 1 includes the light emitting device 10, a reflective mirror 2, an attachment member 3 and a filter member 4. The light emitting device 10 includes a light source 11 and a fluorescent member 12.

The light source 11 emits laser light that is near-ultraviolet light having a light emission peak in a wavelength range of 350 nm to 420 nm. The fluorescent member 12, the details of which will be described later, has fluorescent bodies 13 (see FIG. 2), and emits fluorescent light whose wavelength is converted by being excited by light emitted from the light source 11.

The fluorescent member 12 includes three types of fluorescent bodies 13, and they convert the near-ultraviolet excitation light into red light, green light and blue light, respectively. In this way, the red light, the green light and the blue light, that is, fluorescent light, emitted from the fluorescent member 12 are mixed, and thus it is possible to obtain white light.

Since, in excitation by laser light, its excitation density is increased, oxynitride or nitride fluorescent bodies 13 having a high temperature resistance are more preferably used. As the fluorescent body 13 that converts the near-ultraviolet light into the red light, for example, $CaAlSiN_3$:Eu can be used. As the fluorescent body 13 that converts the near-ultraviolet light into the green light, for example, β-SiAlON:Eu can be used. As the fluorescent body 13 that converts the near-ultraviolet light into the blue light, for example, $(Sr, Ca, Ba, Mg)_{10}(PO_4)_6Cl_2$:Eu, $BaMgAl_{10}O_{17}$:Eu or $(Sr, Ba)_3MgSi_2O_8$:Eu can be used. Since $BaMgAl_{10}O_{17}$:Eu has an excellent temperature characteristic, it is more preferably used.

The fluorescent member 12 may be formed such that two types of fluorescent bodies 13 for converting the near-ultraviolet excitation light into yellow light and blue light are included. In this way, the yellow light and the blue light, that is, fluorescent light, emitted from the fluorescent member 12 are mixed, and thus it is possible to obtain pseudo white light. As the fluorescent body that converts the near-ultraviolet light into the yellow light, for example, Ca-α-SiAlON:Eu can be used.

In the above description, since the light emitting device 10 is utilized as the headlight of an automobile, a case where illumination light is white light or pseudo white light has been described. When the light emitting device 10 is not utilized as the headlight of an automobile, the present invention is not limited to this configuration, and the illumination light may be light of a color, such as blue, green or red, other than white light. The fluorescent bodies 13 included in the fluorescent member 12 may include only one type of various fluorescent bodies emitting light of blue, green, red and the like.

The reflective mirror 2 is formed with a resin molded member, and has a through hole 2b through which light emitted from the light source 11 passes. A reflective surface 2a that is a paraboloidal surface is formed on the inner surface of the reflective mirror 2. The reflective surface 2a is coated with a metal (such as silver or aluminum) having a high reflectivity or the like. The reflective mirror 2 may be formed of metal.

The reflective mirror 2 is not limited to the reflective mirror 2 including the paraboloidal surface; the reflective mirror 2 may include an elliptical surface, a spherical surface, a free-form surface or a non-spherical surface. A member that forms the reflective mirror 2 is not limited to metal; it may be a resin or the like. The reflective surface 2a is not limited to the reflective surface 2a coated with metal; the reflective surface may be formed based on the difference in reflectivity between the member of the reflective mirror 2 and the environment therearound.

The attachment member 3 is formed of a metal such as Al or Cu, a ceramic or the like having a high thermal conductivity, and is fixed to the reflective mirror 2 to hold the fluorescent member 12. Since the attachment member 3 has a high thermal conductivity, heat produced by the fluorescent member 12 is dissipated through the attachment member 3.

The attachment member 3 is arranged substantially on the center axis of the reflective surface 2a; the fluorescent member 12 is arranged on an inclination surface 3a that is inclined at a predetermined inclination angle a (for example, 0° to 30°) with respect to the axial direction. Thus, the light emitted from the light source 11 enters the fluorescent member 12 at a predetermined entrance angle. Here, the application region of the fluorescent member 12 to which light is applied by the light source 11 is arranged in the focal point of the reflective surface 2a. Hence, the fluorescent light emitted from the fluorescent member 12 is reflected off the reflective surface 2a into parallel light.

The filter member 4 is fixed to the reflective mirror 2 and the attachment member 3, and covers an opening surface 2c of the reflective mirror 2 at one end in the axial direction. The filter member 4 absorbs or reflects the light (near-ultraviolet light) emitted from the light source 11 and thereby interrupts the light, and transmits the fluorescent light (the red light, the green light and the blue light) emitted from the fluorescent member 12. As the filter member 4, for example, a glass material such as ITY-418 made by Isuzu Glass Company Ltd. or L42 made by HOYA Corporation can be used.

Figure 2:
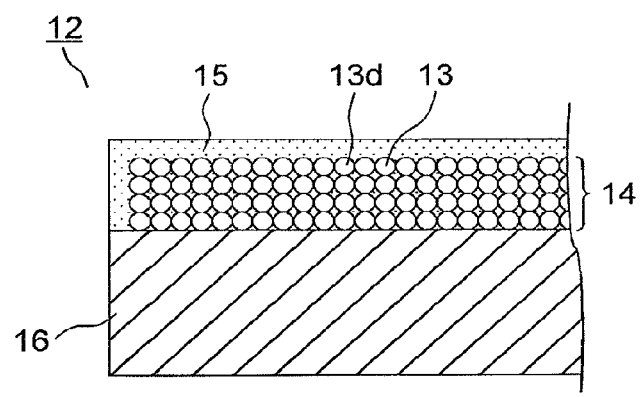
FIG. 2 is a longitudinal cross-sectional view showing a fluorescent member of the light emitting device according to the embodiment of the present invention.

FIG. 2 shows a longitudinal cross-sectional view of the fluorescent member 12. The fluorescent member 12 forms a fluorescent body layer 14 that includes the fluorescent body 13 on a substrate 16; the surface of the fluorescent body layer 14 is coated with a coating material 15.

The substrate 16 is formed of a metal, a ceramic or the like that has a high thermal conductivity. Thus, the heat produced by the fluorescent member 12 is transmitted through the substrate 16 to the attachment member 3 and is dissipated. When the substrate 16 is formed of a metal such as Cu, Ag or Al, as described later, it can be used as an electrode when the fluorescent body layer 14 is formed by an electrophoresis method. When the substrate 16 formed with an insulator is used, the surface is subjected to metal evaporation, and thus it is possible to use the substrate 16 as the electrode of electrophoresis.

In order to enhance the adherence to the fluorescent body layer 14, it is more preferable to use a material having a low thermal expansion coefficient as the substrate 16. As the material having a low thermal expansion coefficient and a high thermal conductivity, Si, GaN, AlN or the like can be used. A material which absorbs only small amounts of near-ultraviolet light and visible light and which has a high reflectivity is more preferably used as the substrate 16 so that light which enters the fluorescent body 13 from the light source 11 but which is not converted in the fluorescent body 13 is reflected.

The fluorescent body layer 14 is formed by depositing the particles 13d of the fluorescent body 13 on the substrate 16. Here, most of the particles 13d are close to each other, and the particles 13d are continuously arranged on the substrate 16. Hence, between the surface of the fluorescent body layer 14 and the substrate 16, the particles 13d of the fluorescent body 13 are continuously connected. Since, unlike the conventional example, the particles 13d of the fluorescent body 13 are not dispersed into a sealant, it is possible to increase the density of the fluorescent body 13 in the fluorescent body layer 14. The particles 13d of the fluorescent body 13 are excited by the excitation light emitted from the light source 11 (see FIG. 1), and thus fluorescent light is emitted.

The coating material 15 is formed of $TiO_2$ or the like, and is adhered to the surface of the fluorescent body layer 14. Thus, it is possible to prevent the particles 13d of the fluorescent body 13 deposited on the substrate 16 from coming off. The coating material 15 coating the fluorescent body layer 14 is formed of an inorganic material such as $TiO_2$, and thus it is unlikely to be degraded by ultraviolet light or heat. In this way, it is possible to prevent the coating material 15 from discoloring and to prevent variations in chromaticity and the decrease in the efficiency of light emission.

Figure 3:
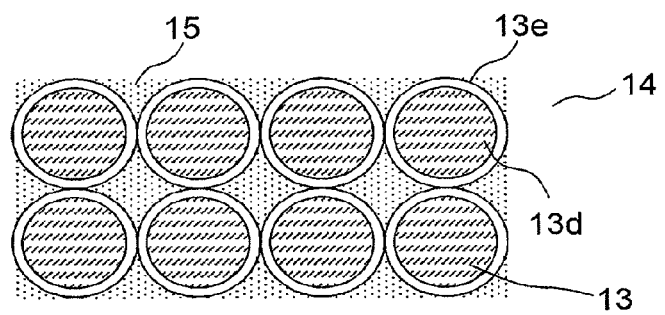
FIG. 3 is an enlarged view showing a fluorescent body layer of the fluorescent member of the light emitting device according to the embodiment of the present invention.

FIG. 3 is an enlarged view of the fluorescent body layer 14. The particles 13d of the fluorescent body 13 are coated with a binder 13e such as silica. The adjacent particles 13d are adhered by the binder 13e. Thus, it is possible to more reliably prevent the particles 13d from coming off. Moreover, it is possible to reliably make the adjacent particles 13d in contact with each other and to enhance the transmission of heat between the particles 13d. In addition, the binder 13e is formed of silica, and thus, as described later, when the fluorescent body layer 14 is formed by the electrophoresis method, the binder 13e is charged, with the result that it is possible to easily deposit the particles 13d on the substrate 16. Furthermore, as compared with a case where an adhesive such as a resin is used as the binder 13e, it is possible to reduce degradation caused by ultraviolet light or heat.

In the head light 1 configured as described above, the near-ultraviolet excitation light is emitted from the light source 11 as indicated by an arrow A1 (see FIG. 1). The light emitted from the light source 11 is applied through the through hole 2b of the reflective mirror 2 onto the fluorescent body layer 14 of the fluorescent member 12. The fluorescent body 13 is excited by the light entering the fluorescent member 12, and the red light, the green light and the blue light, that is, fluorescent light are emitted from the fluorescent member 12 as indicated by an arrow A2 (see FIG. 1). Here, since the fluorescent body 13 of the fluorescent body layer 14 is formed at a high density, it is possible to enhance the efficiency of light emission of the light emitting device 10.

The fluorescent light of the colors emitted from the fluorescent member 12 is mixed, and thus it is possible to obtain white light. Then, the white light is reflected off the reflective surface 2a of the reflective mirror 2 as indicated by an arrow A3 (see FIG. 1), and is emitted as parallel light through the filter member 4. In this way, white illumination light illuminates the front area.

The fluorescent body 13 produces heat by the excitation light having a high excitation density emitted from the high-power light source 11. The fluorescent body layer 14 has the fluorescent body 13 at a high density and is formed to be thin, and the particles 13d of the fluorescent body 13 are higher in thermal conductivity than a generally used sealant such as a resin or an inorganic glass. Thus, the heat produced by the fluorescent body 13 is transmitted through the adjacent particles 13d of the fluorescent body 13 to the substrate 16 and the attachment member 3 and is dissipated. Here, the fluorescent body 13 on the surface of the fluorescent body layer 14 mainly contributes to the fluorescence, and thus the heat is produced. In this way, the heat produced by the fluorescent body 13 on the surface of the fluorescent body layer 14 is efficiently transmitted through the continuously connected particles 13d and is dissipated from the substrate 16.

Thus, it is possible to prevent the degradation of the fluorescent body 13 caused by heat and to enhance the efficiency of light emission of the light emitting device 10. The fluorescent bodies 13 that are different in temperature quenching according to the light emission color are sufficiently cooled, and thus it is possible to prevent variations in the chromaticity of the light emitting device 10.

Figure 4:
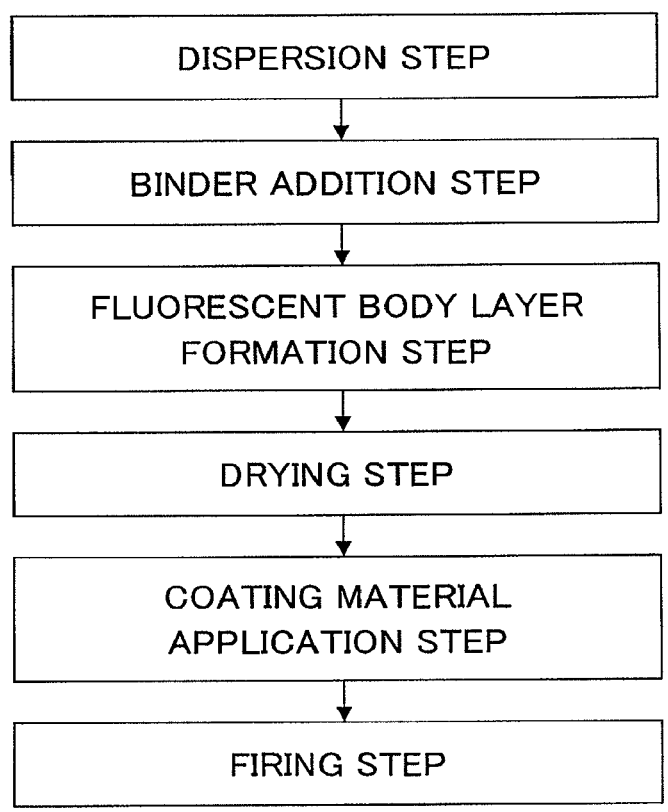
FIG. 4 is a process diagram showing a method of manufacturing the fluorescent member of the light emitting device according to the embodiment of the present invention.

FIG. 4 is a process diagram showing a method of manufacturing the fluorescent member 12. In a dispersion step, the particles 13d of the fluorescent body 13 in the form of powder are added to a dispersion medium such as ethanol, and the agglomeration is broken with an ultrasonic homogenizer or the like and is dispersed. In a binder addition step, hydrolysis is performed by adding water and an acid to TEOS (ethyl silicate or tetraethoxysilane), and a solution of a precursor of silica is produced. Then, the solution of the precursor of silica is added to the dispersion medium, and is stirred. In this way, the precursor of silica covers the particles 13d of the fluorescent body 13.

In a fluorescent body layer formation step, electrodes are immersed in the dispersion medium where the particles 13d of the fluorescent body 13 are dispersed, and a voltage is applied. In this way, the particles 13d of the fluorescent body 13 are deposited, by the electrophoresis method, on the substrate 16 arranged on one of the electrodes, and thus the fluorescent body layer 14 is formed. Here, the precursor of silica is positively charged, and thus it is possible to easily deposit the particles 13d on the substrate 16 arranged on the negative pole.

It is also possible to easily control the film thickness of the fluorescent body layer 14 by the applied voltage or the time during which the voltage is applied. For example, the fluorescent body layer 14 is preferably a few layers of the particles 13d in film thickness (for example, about 30 to 50 μm by depositing the particles 13d whose diameter is about 10 μm). When one layer of the particles 13d is only formed, it is difficult to produce a uniform film having a high density; as a larger number of layers are formed, the distance between the particles 13d on the surface and the substrate 16 is increased, and thus the dissipation is degraded. When the substrate 16 is formed of a material having a high electrical conductivity or when the substrate 16 has a coating having a high electrical conductivity, the substrate 16 can be used as the electrode for electrophoresis.

In a drying step, the substrate 16 on which the particles 13d of the fluorescent body 13 are deposited is taken out of the dispersion medium, and is subjected to natural drying. In a coating material application step, spin coating is performed by coating the surface of the fluorescent body layer 14 with an alkoxide of $TiO_2$. In a firing step, the coating material 15 is fired at a predetermined temperature. In this way, the precursor of silica becomes silica to form the binder 13e, and the alkoxide of $TiO_2$ becomes $TiO_2$ to form the coating material 15.

In a fluorescent body layer formation step, the fluorescent body layer 14 may be formed by a precipitation method of precipitating the particles 13d of the fluorescent body 13 dispersed in the dispersion medium on the substrate 16 by its own weight. The fluorescent body layer 14 may be formed by a printing method of printing the layers of the particles 13d of the fluorescent body 13 on the substrate 16 with screen printing or by a coating method of coating the particles 13d of the fluorescent body 13 on the substrate 16 with a dispenser. However, even with the printing method or the coating method, it is difficult to form the fluorescent body layer 14 where the particles 13d of the fluorescent body 13 are uniformly deposited on the substrate 16. Hence, preferably, the fluorescent body layer 14 is formed by the electrophoresis method or the precipitation method because it is possible to easily realize the fluorescent body layer 14 where the particles 13d are uniformly arranged at a high density.

Figure 5:
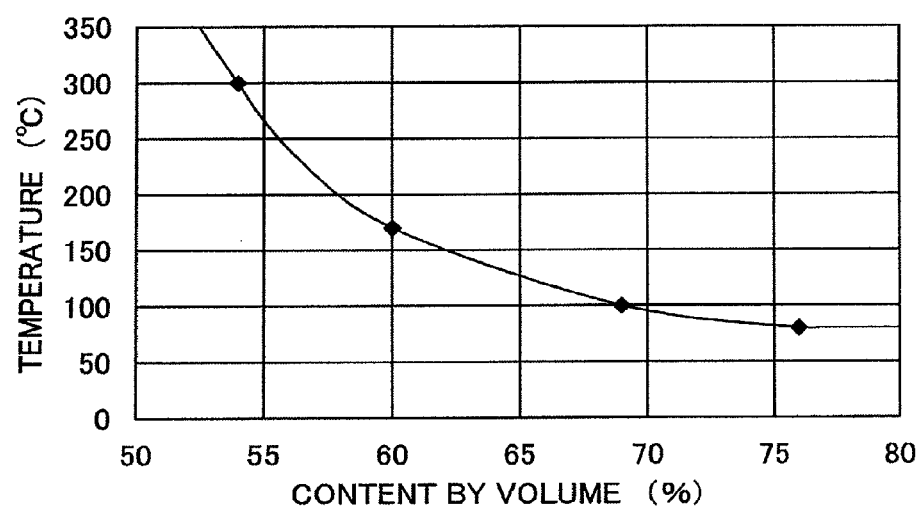
FIG. 5 is a diagram showing a relationship between the temperature of the fluorescent member of the light emitting device according to the embodiment of the present invention and a content of a fluorescent body.

FIG. 5 is a diagram showing a relationship between a content of the fluorescent body 13 in the fluorescent body layer 14 by volume and the temperature of the fluorescent member 12. The vertical axis represents the temperature (unit: °C.) of the fluorescent member 12; the horizontal axis represents the content (unit: %) of the fluorescent body 13 by volume. In a sample which is used for the measurement, the substrate 16 is formed of Al such that its size is 1 mm square×1 mm thick, β-SiAlON:Eu is used as the fluorescent body 13 and the fluorescent body layer 14 is formed such that its thickness is 50 μm. Laser light having a wavelength of 405 nm is emitted from the light source 11. Here, the power of the light source 11 is set at 5 watts for the sample in which the content of the fluorescent body 13 is 76%, and the power of the light source 11 is varied such that the same amount of fluorescent light is emitted from each sample The content of the fluorescent body 13 by volume is obtained by averaging the rate of occupation of the area of the particles 13d in a plurality of cross sections perpendicular to the substrate 16 of the fluorescent body layer 14.

The filling rate (the content by volume) in a crystal structure where spherical particles of the same size are formed with the hexagonal closest packing structure of the highest density is 74%. Since variations in the shape and the size of the particles 13d of the actual fluorescent body 13 are produced, in FIG. 5, the content by volume in a sample is 76% that is higher than an ideal closest packing rate. When the content of the fluorescent body 13 by volume is 69% or more, saturation occurs at the same temperature as a state (76%) where the fluorescent body layer 14 is filled with the particles 13d at such a high density as to be the maximum content by volume. Hence, the content of the fluorescent body 13 by volume is more preferably set equal to or higher than 69% because it is possible to acquire the maximum heat dissipation capacity of the fluorescent body layer 14.

In the present embodiment, since the fluorescent member 12 has, on the substrate 16 formed with a highly heat conductive member, the fluorescent body layer 14 where the particles 13d of the fluorescent body 13 are deposited, the fluorescent body layer 14 has the fluorescent body 13 at a high density and is formed to be thin. Thus, it is possible to enhance the dissipation of the heat produced by the fluorescent body 13 and to increase the rate of absorbing the excitation light. It is therefore possible to enhance the efficiency of light emission of the light emitting device 10 and to prevent variations in chromaticity caused by temperature quenching of a plurality of fluorescent bodies 13 that emit light of different colors.

Since the particles 13d of the fluorescent body 13 are continuously connected between the surface of the fluorescent body layer 14 and the substrate 16, the heat produced by the fluorescent body 13 on the surface, which mainly contributes to the fluorescence is transmitted to the substrate 16 through the continuous particles 13d. Thus, it is possible to more enhance the dissipation of the heat produced by the fluorescent body 13.

Since the content of the fluorescent body 13 in the fluorescent body layer 14 by volume is 69% or more, it is possible to acquire the maximum dissipation ability of the fluorescent body layer 14 and thereby more enhance the heat dissipation.

Since the coating material 15 adhered to the fluorescent body layer 14 is arranged on the surface of the fluorescent body layer 14, it is possible to prevent the particles 13d of the fluorescent body 13 deposited on the substrate 16 from coming off.

Since the coating material 15 is formed of $TiO_2$, it is possible to easily coat the surface of the fluorescent body layer 14. In addition, since the coating material 15 is formed of an inorganic material, it is unlikely to be degraded by ultraviolet light or heat, with the result that it is possible to prevent the coating material 15 from discoloring and to prevent variations in chromaticity and the decrease in the efficiency of light emission.

Since the adjacent particles 13d of the fluorescent body 13 are adhered with the binder 13e coating the particles 13d of the fluorescent body 13, it is possible to more reliably prevent the particles 13d of the fluorescent body 13 deposited on the substrate 16 from coming off Since the binder 13e is formed of silica, it is possible to easily coat and adhere the particles 13d. It is also possible to easily deposit the particles 13d on the substrate 16 with the binder 13e that is charged when the fluorescent body layer 14 is formed by the electrophoresis method. Furthermore, as compared with a case where an adhesive such as a resin is used as the binder 13e, it is possible to reduce degradation resulting from ultraviolet light and heat.

Figure 6:
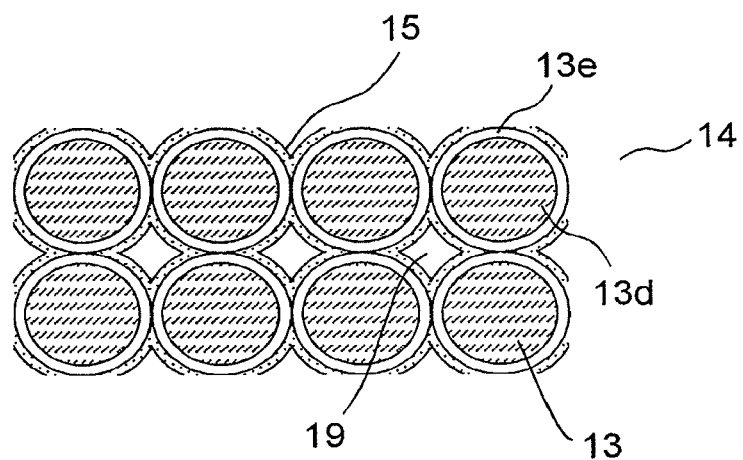
FIG. 6 is a longitudinal cross-sectional view showing another fluorescent body layer of the fluorescent member of the light emitting device according to the embodiment of the present invention.

As shown in FIG. 3 described above, the areas between the particles 13d of the fluorescent body 13 are filled with the coating material 15, and thus it is possible to more reliably prevent the particles 13d from coming off. Moreover, since the heat produced by the fluorescent body 13 is also transmitted to the substrate 16 through a heat transmission path via the coating material 15, it is possible to more enhance the dissipation of the fluorescent member 12. When a high degree of adherence of the particles 13d by the binder 13e and a sufficient degree of dissipation can be acquired, as shown in FIG. 6, the surface of the binder 13e may be coated with the coating material 15, and gaps 19 may be formed between the particles 13d.

Since the dispersion step of dispersing the particles 13d of the fluorescent body 13 in the dispersion medium and the fluorescent body layer formation step of forming the fluorescent body layer 14 by depositing the particles 13d of the fluorescent body 13 dispersed in the dispersion medium on the substrate 16 by the electrophoresis method or the precipitation method are provided, it is possible to easily form the fluorescent body layer 14 where the particles 13d of the fluorescent body 13 are deposited on the substrate 16.

Since the coating material application step of applying the alkoxide of $TiO_2$ onto the fluorescent body layer 14 and the firing step of firing the fluorescent member 12 taken out of the dispersion medium and coating the fluorescent body layer 14 with $TiO_2$ are provided, it is possible to more easily adhere the fluorescent body layer 14 with $TiO_2$.

Since the binder addition step of adding the precursor of silica to the dispersion medium and coating the particles 13d of the fluorescent body 13 with the precursor of silica is provided, in the fluorescent body layer formation step, the fluorescent body layer 14 is formed by the electrophoresis method and, in the firing step, the fluorescent member 12 is fired and the particles 13d of the fluorescent body 13 are coated with silica, it is possible to easily adhere the particles 13d with the binder 13e made of silica. In the fluorescent body layer formation step, the particles 13d can easily be deposited on the substrate 16 with the charged precursor of silica.

Figure 7:
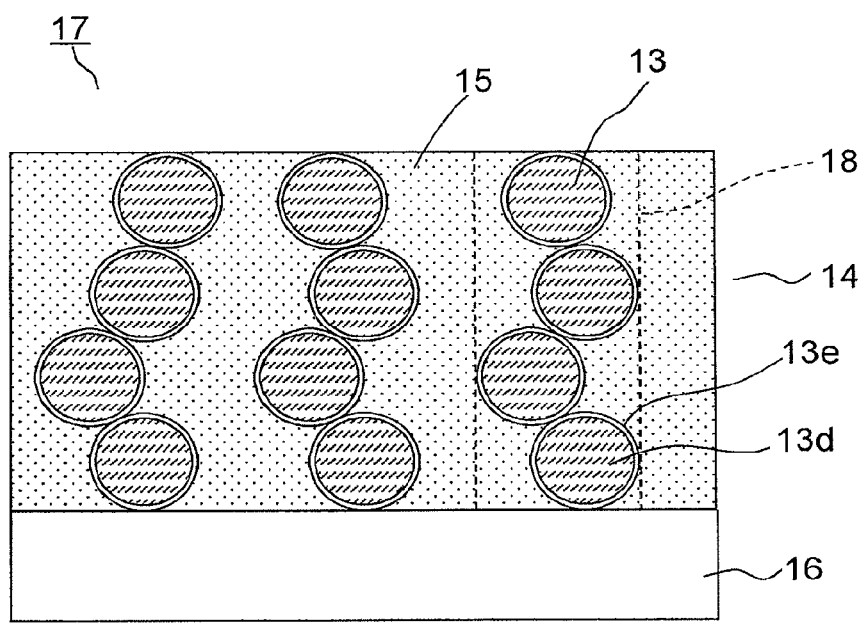
FIG. 7 is a longitudinal cross-sectional view showing a variation of the fluorescent member of the light emitting device according to the embodiment of the present invention.

Although, in the present embodiment, the case where the fluorescent body particles 13d are closely deposited, as the fluorescent member 12, on the substrate 16 has been described, the present invention is not limited to this configuration. FIG. 7 shows a longitudinal cross-sectional view of a fluorescent member 17 that is a variation of the fluorescent member 12 (see FIG. 2). The fluorescent member 17 forms the fluorescent body layer 14 including the fluorescent body 13 on the substrate 16; all or part of the gaps between the surface of the fluorescent body layer 14 and the fluorescent body layer 14 are coated with the coating material 15.

The fluorescent body 13 forms, in the fluorescent body layer 14, a fluorescent body chain 18 where the particles 13d of the fluorescent body 13 are continuously connected between the surface of the fluorescent body layer 14 and the substrate 16. The fluorescent body chain 18 transmits heat produced by the particles 13d on the surface mainly contributing to the fluorescence to the substrate 16 through the other continuously connected particles 13d. Here, the particles 13d of the fluorescent body 13 are higher in thermal conductivity than a generally used sealant such as a resin or an inorganic glass. Hence, as compared with the case where the heat is dissipated through the sealant to the substrate 16, the dissipation is enhanced by dissipating the heat through the fluorescent body chain 18 where the particles 13d are continuously connected.

Although, in the present embodiment, the light emitting device 10 is incorporated in the head light 1 of an automobile, the head light may be incorporated in an airplane, a ship, a robot, a motor bike, a bicycle or another moving unit. The light emitting device 10 may be used for an illumination device such as a downlight or a spotlight, a printer, a copying machine or the like.

The light source 11 and the fluorescent body 13 may be provided such that the light emitting device 10 emits light other than white light. The fluorescent body 13 may convert the excitation light into light other than visible light. For example, when the excitation light is converted into infrared light, the light emitting device 10 can be applied to a night-time illumination device with a security CCD camera or the like.

LIST OF REFERENCE NUMERALS 1 head light
2 reflective mirror
3 attachment member
4 filter member
10 light emitting device
11 light source
12, 17 fluorescent member
13 fluorescent body 13d particle
13e binder
14 fluorescent body layer
15 coating material
16 substrate
18 fluorescent body chain
19 gap

What is claimed is:

1. A light emitting device comprising:
   a light source which emits laser light; and
   a fluorescent member which includes a fluorescent body that is excited by the light emitted from the light source so as to emit light,
   wherein the fluorescent member includes:
   a substrate; and
   a fluorescent body layer in which particles of the fluorescent body are provided on one surface of the substrate and in which the particles of the fluorescent body are connected to each other, and
   the laser light enters the fluorescent body layer through a surface on a side opposite to the substrate.

2. The light emitting device of claim 1, wherein a coating material which adheres the particles of the fluorescent body is provided.

3. The light emitting device of claim 2, wherein the coating material is formed of $TiO_2$.

4. The light emitting device of claim 3, wherein the coating material is formed by firing an alkoxide of $TiO_2$ applied onto the fluorescent body layer.

5. The light emitting device of claim 1, further comprising:
   a reflective mirror which is opposite the fluorescent body layer.

6. The light emitting device of claim 1, wherein a content of the fluorescent body in the fluorescent body layer by volume is 69% or more.

7. The light emitting device of claim 1, further comprising:
   a binder which coats the particles of the fluorescent body.

8. The light emitting device of claim 7, wherein the binder is formed of silica.

9. The light emitting device of claim 8, wherein the binder is formed by providing, on the substrate, the particles of the fluorescent body coated with a precursor of silica and thereafter firing the fluorescent member.

* * * * *